(12) United States Patent
Kuo

(10) Patent No.: US 6,605,495 B1
(45) Date of Patent: Aug. 12, 2003

(54) METHOD OF FORMING A THIN FILM TRANSISTOR LIQUID CRYSTAL DISPLAY

(75) Inventor: Tai-Yu Kuo, Hsin-Chu Hsien (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 10/248,441

(22) Filed: Jan. 21, 2003

(30) Foreign Application Priority Data

Aug. 1, 2002 (TW) ........................................ 91117382 A

(51) Int. Cl.[7] .............................................. H01L 21/00
(52) U.S. Cl. ........................ 438/151; 438/149; 438/157
(58) Field of Search ................... 438/151, 149, 438/157

(56) References Cited

U.S. PATENT DOCUMENTS

| | | | | |
|---|---|---|---|---|
| 5,475,246 A | * | 12/1995 | Wei et al. | |
| 5,668,032 A | * | 9/1997 | Holmberg et al. | |
| 6,014,191 A | * | 1/2000 | Kim et al. | |
| 6,317,176 B1 | * | 11/2001 | Kim et al. | |
| 6,380,992 B1 | * | 4/2002 | Lee | |
| 6,403,980 B1 | * | 6/2002 | Park | |
| 6,429,908 B1 | * | 8/2002 | Lim | |
| 6,441,401 B1 | * | 8/2002 | Jung et al. | |
| 2002/0171781 A1 | * | 11/2002 | Kim | |

* cited by examiner

Primary Examiner—John F. Niebling
Assistant Examiner—Stanetta Isaac
(74) Attorney, Agent, or Firm—Winston Hsu

(57) ABSTRACT

A method of forming a thin film transistor liquid crystal display includes forming a gate, a scan line and two first repair pads on a substrate first. A dielectric layer, a semiconductor layer, an etching stop layer and a metal layer are thereafter formed. After that, the metal layer and the semiconductor layer are etched to form a signal line and a source/drain. A passivation layer is formed and portions of the drain are exposed. Finally, a pixel electrode is formed and a second repair pad on top of each of the first repair pads is formed to form a repair circuit.

19 Claims, 19 Drawing Sheets

METHOD OF FORMING A THIN FILM TRANSISTOR LIQUID CRYSTAL DISPLAY

BACKGROUND OF INVENTION

1. Field of the Invention

The present invention relates to a method of fabricating a thin film transistor liquid crystal display(TFT-LCD), and more particularly, to a method of fabricating a thin film transistor liquid crystal display with repair circuit.

2. Description of the Prior Art

Due to continued development and advancement in electrical technology, the variety of applications as well as the demand for liquid crystal displays is ever increasing. A liquid crystal display(LCD) is one type of flat panel display and is employed extensively in applications ranging from small-scale products, such as a phygmomanometer, to various portable electronic devices such as PDAs and notebooks, and even to the commercial large panel displays. Since an LCD has the advantages of lightweight, low energy consumption, and free of radiation emission, the LCD is extensively applied to informational products and has a great potential for the future. Basically, the conventional TFT-LCD includes a transparent substrate having a matrix of thin film transistors, pixel electrodes, scan lines, signal lines orthogonal to the scan lines, a color filter, and liquid-crystal materials between the transparent substrate and the color filter. With the supporting electrical devices, such as capacitors and bonding pads, the TFT-LCD device drives liquid-crystal-pixels to generate color-rich graphics. However, when fabricating the TFT-LCD, point defects or line defects readily occur on the crossover region of a scan line and a signal line and on the thin film transistor due to human error and processing factors.

Please refer to FIG. 1 and FIG. 2. FIG. 1 is a top view of a single TFT-LCD device 10 according to a prior art. FIGS. 2A–2E are cross-sectional diagrams of fabricating a thin film transistor and a crossover region of a scan line and a signal line of the TFT-LCD device 10 shown in FIG. 1 according to the prior art. The prior art technology utilizes photo-etching-processes (PEP) five times to form the TFT-LCD device 10 on a transparent glass substrate 11. The substrate may be a quartz substrate or a plastic substrate.

When fabricating the LCD panel, various devices including a thin film transistor, a pixel electrode, a scan line, a signal line, a capacitor, and a bonding pad are formed on the panel. Since each device is disposed according to a special layout and has a specific special relationship with the other devices, it is too complicated to show all of them in a cross-sectional diagram and a top view diagram. Therefore, only the thin film transistor 44, the pixel electrode 42, the scan line 18, the signal line 36, and a crossover region 14 of the scan line 18 and the signal line 36 are shown in FIG. 1 and FIG. 2.

Referring to FIG. 1 and FIG. 2, the glass substrate 11 (not shown in FIG. 1) comprises at least one thin film transistor (TFT) 44, the scan line 18, and the signal line 36.The thin film transistor 44 is disposed in the transistor region 12 on the glass substrate 11. The scan line 18 and the signal line 36 orthogonal to the scan line 18, cross in the crossover region 14 on the glass substrate 11. A source electrode 32 of the thin film transistor 44 is connected to the signal line 36, and a drain electrode 34 of the thin film transistor 44 is connected to a pixel electrode 42 through a via hole 41. An etching stop pattern 26 is disposed on a gate electrode 16.

In the prior art method, a first metal layer(not shown) is deposited on the surface of the glass substrate 11, then a first photo-etching-process(PEP-1) is performed to form the gate electrode 16 and the scan line 18 passing through the crossover region 14 on the surface of the glass substrate 11, as shown in FIG. 2A. The gate electrode 16 is connected to the scan line 18. The first metal layer (not shown) is a single-layered metal or a double-layered metal. In the previous case, the first metal layer (not shown) is composed of tungsten (W), chrome (Cr), molybdenum (Mo) or the molybdenum-tungsten (MoW) alloy. In the latter case, the first metal layer (not shown) is composed of chrome (Cr) on top of aluminum (Al), molybdenum (Mo) on top of aluminum, molybdenum on top of aluminum-neodynium (AlNd) alloy, molybdenum-tungsten (MoW) alloy on top of aluminum, or molybdenum-tungsten (MoW) alloy on top of aluminum-neodynium (AlNd) alloy. The above-mentioned material compositions of the double-layered metal are examples frequently seen. Actually, the material compositions of the double-layered metal could be the random combination of chrome (Cr), aluminum (Al), molybdenum (Mo), the aluminum-neodynium (AlNd) alloy, and the molybdenum-tungsten (MoW) alloy.

After the PEP-1, a gate insulator layer 22 and a semiconductor layer 24 are deposited on the glass substrate 11. The gate insulator layer 22, composed of silicon oxide ($SiO_x$), silicon nitride ($SiN_y$), or silicon oxynitride ($SiO_xN_y$), may be a single dielectric layer or a composite dielectric layer. The semiconductor layer 24, also called as an active layer, is a hydrogenated amorphous silicon layer (α-Si:H layer), and is used as a channel when the thin film transistor 44 is turning on. The semiconductor layer 24 could be a polysilicon layer.

Then, an etching stop layer (not shown), composed of silicon nitride, is formed on the glass substrate 11. Actually, the gate insulator layer 22, the semiconductor layer 24, and the etching stop layer (not shown) are formed in the same chamber during a continuous plasma enhanced chemical vapor deposition (PECVD) process. A second photo-etching-process(PEP-2) is thereafter performed to form an etching stop pattern 26 above the gate electrode 16 to prevent the semiconductor layer 24 from damaging in subsequent etching process. In the crossover region 14, the etching stop layer (not shown) is not retained at all, as is shown in FIG. 2B.

As shown in FIG. 2C, a doped semiconductor layer ($n^+$ layer, not shown) is deposited on the semiconductor layer 24 and the etching stop pattern 26. The doped semiconductor layer (not shown) is usually composed of amorphous silicon doped with phosphor. After that, a second metal layer (not shown) is deposited on the doped semiconductor layer (not shown). A third photo-etching-process(PEP-3) is then performed to pattern the second metal layer (not shown), the doped semiconductor layer (not shown) and the semiconductor layer 24 for forming the source electrode 32, the drain electrode 34 and the active area (not shown) of the thin film transistor in the transistor region 12, and a signal line 36 passing through the crossover region 14 simultaneously.

The second metal layer (not shown) is a single-layered metal or a multi-layered metal. In the previous case, the second metal layer (not shown) is composed of tungsten (W), chrome (Cr) or Molybdenum (Mo). In the latter case, the second metal layer (not shown) is composed of chrome (Cr) on top of aluminum (Al), molybdenum (Mo) on top of aluminum, molybdenum on top of aluminum-neodynium (AlNd) alloy, molybdenum-tungsten (MoW) alloy on top of aluminum, or molybdenum-tungsten (MoW) alloy on top of aluminum-neodynium (AlNd) alloy or sandwich structure as molybdenum/aluminum/molybdenum (Mo/Al/Mo) or molybdenum/aluminum-neodynium/molybdenum (Mo/

AlNd/Mo). The above-mentioned material compositions of the multi-layered metal are examples frequently seen. Actually, the material compositions of the multi-layered metal could be the random combination of chrome (Cr), aluminum (Al), molybdenum (Mo), the aluminum-neodynium (AlNd) alloy, and molybdenum-tungsten (MoW) alloy. The doped semiconductor layer (not shown) is used to improve the ohmic contact of the second metal layer (not shown) to the semiconductor layer 24 to avoid the contacting problems between the second metal layer (not shown) and the semiconductor layer 24.

A passivation layer 38, composed of silicon oxide or silicon nitride, is thereafter formed on the glass substrate 11. After that, a fourth photo-etching-process(PEP-4) is performed to remove portions of the passivation layer 38 atop the drain electrode 34 of the thin film transistor 44 so as to form a via hole 41 in the passivation layer 38. The via hole 41 extends from the top surface of the passivation layer 38 up to the top surface of the drain electrode 34 to expose portions of the drain electrode 34 as is shown in FIG. 2D, or extends from the top surface of the passivation layer 38 up to the top surface of the first metal electrode in the peripheral area of the panel for contacting with the common electrode of color filter in subsequent process (not shown).

Finally, a transparent conductive layer(not shownO, composed of indium tin oxide (ITO) or indium zinc oxide (IZO), is formed on glass substrate 11. Then, a fifth photo-etching-process(PEP-5) is performed for forming a pixel electrode 42 electrically connected to the drain electrode 34 of the thin film transistor 44 via via hole 41 so as to complete the fabrication of the thin film transistor 44. At this point, as shown in FIG. 2E, only the doped semiconductor layer (not shown), semiconductor layer 24 and the gate insulator layer 22 are positioned between the signal line 36 and the scan line 18 in the crossover region 14 covered by the passivation layer 38.

In summary, the prior art method of fabricating a thin film transistor liquid crystal display does not provide any repair circuit. However, the yield of the thin film transistor liquid crystal display is readily affected due to various defects occurring after repeated processing. This problem tends to be more and more serious as the size of the liquid crystal display becomes larger, especially at the crossover region 14, where the signal line 36 and the scan line 18 pass through at the same time, and around the transistor region 22. Because the taper shape of the scan line 18 or the gate electrode 16 at a lower level is not good, the under cut phenomena of the scan line 18 or the gate line exists, the metal eruption phenomenon occurs, and unexpected particles are generated in the semiconductor layer 24 and the gate insulator layer 22, the gate-signal short phenomenon thus occurs after depositing the second metal layer.

Therefore, it is very important to design and make a repair circuit in the thin film transistor, so a laser repair process is performed to ensure a certain production yield after the TFT-LCD device 10 with gate-signal short phenomenon is detected by an array test.

SUMMARY OF INVENTION

It is therefore an object of the claimed invention to provide a method of fabricating a thin film transistor liquid crystal display(TFT-LCD), especially a method of fabricating a thin film transistor liquid crystal display with a laser repair circuit to perform a laser repair process easily.

According to the claimed invention, a substrate is provided first. At least one transistor region for forming a thin film transistor (TFT) and at least one crossover region are on the substrate. A first metal layer is formed on the substrate, then the first metal layer is patterned by removing a part of the first metal layer to form a gate electrode in the transistor area,a scan line passing through the crossover region,and a first repair pad at either side of the crossover region simultaneously on the substrate. Thereafter a dielectric layer and a semiconductor layer are sequentially deposited on the substrate to cover the gate electrode, the scan line, and each first repair pad. After that, an etching stop layer is formed on the semiconductor layer above the gate electrode. A doped semiconductor layer is formed on the semiconductor layer and the etching stop layer. A second metal layer is formed on the doped semiconductor layer. Then the second metal layer, the doped semiconductor layer and the semiconductor layer are patterned by removing a part of the second metal layer, the doped semicondutor layer and the semiconductor layer to form a source electrode and a drain electrode and to define the active area of the thin film transistor in the transistor region and to form a signal line passing through the crossover region simultaneously. A passivation layer is thereafter formed on the substrate. After that, the passivation layer is patterned by removing a part of the passivation layer positioned above the drain electrode to form a via hole extending to the top surface of the drain electrode or extending to the first metal electrode in the peripheral area of the panel for contacting with the common electrode of color filter in subsequent process.

Then a transparent conductive layer is formed on the substrate and the transparent conductive layer fills up the via hole. Finally, the transparent conductive layer is patterned by removing a part of the transparent conductive layer, to form a pixel electrode electrically connected to the drain electrode via the via hole on the substrate and simultaneously form a second repair pad above each first repair pad. Each first repair pad and the second repair pad form a repair circuit region.

The method of fabricating the TFT-LCD device according to the claimed invention is to add a repair circuit into the layout, to simultaneously fabricate a bottom repair pad, connected to the scan line, at either side of the crossover region when forming the scan line, and to retain the transparent conductive layer atop the bottom repair pad when etching the transparent conductive layer. When performing the repair process, a laser repair process includes the steps of cutting off the scan line, punching through the passivation layer and the gate insulator layer, and laser welding the top repair pad is performed to the gate-signal short portion. The repair process is thus very easily performed to ensure a certain production yield without adding extra process steps.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
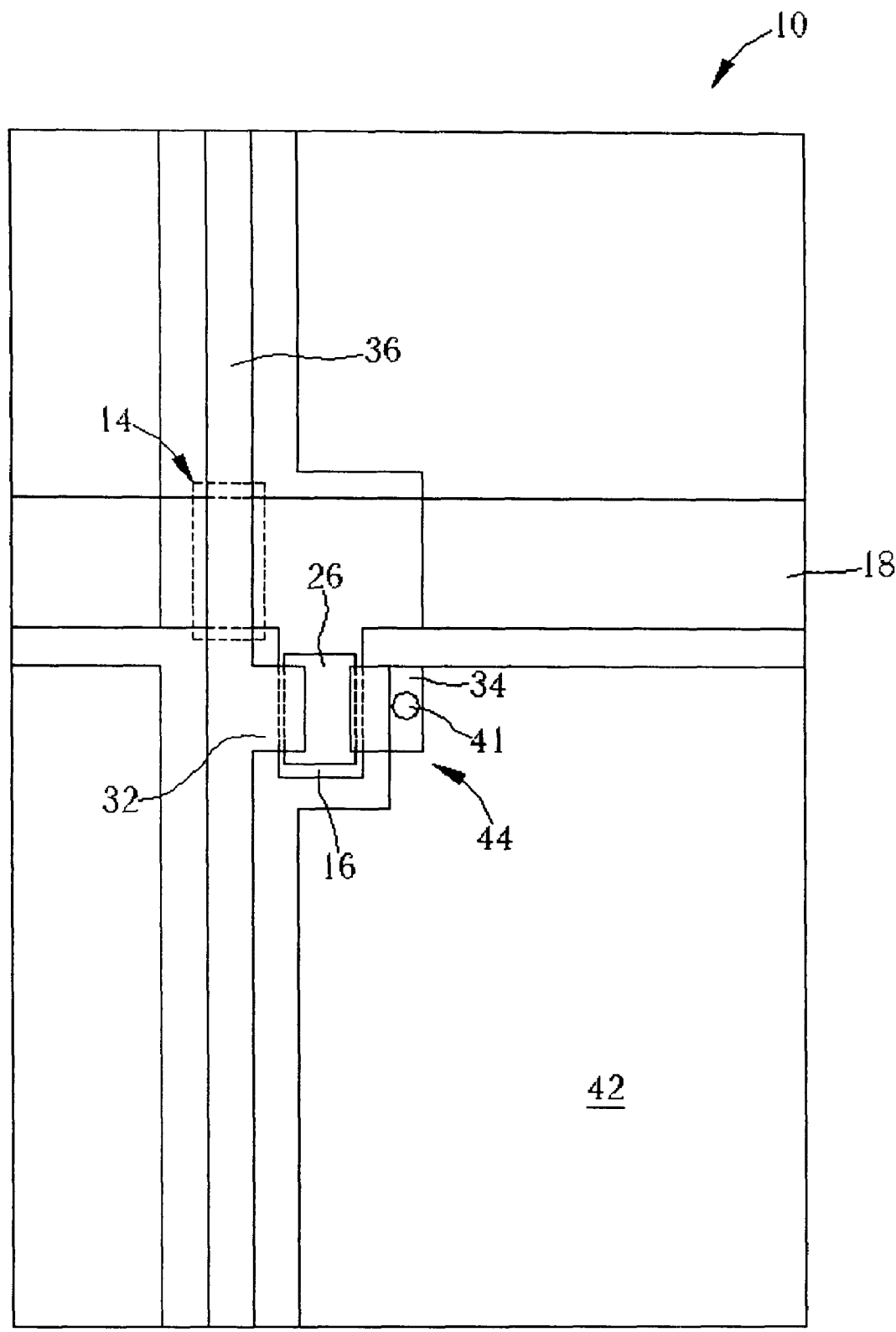
FIG. 1 is a top view of a single TFT-LCD device according to a prior art.
Figure 2A:
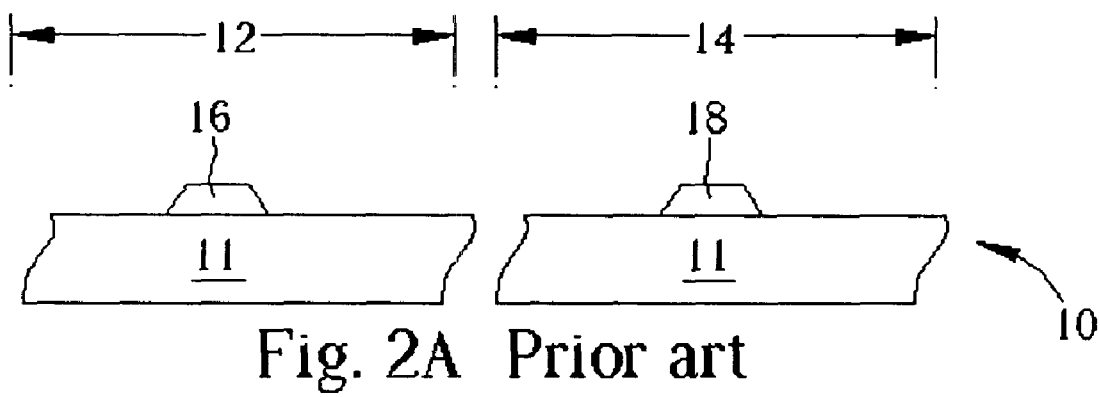
FIGS. 2A–2E are cross-sectional diagrams of fabricating a thin film transistor and a crossover region of a scan line and a signal line of the TFT-LCD device shown in FIG. 1.
Figure 2B:
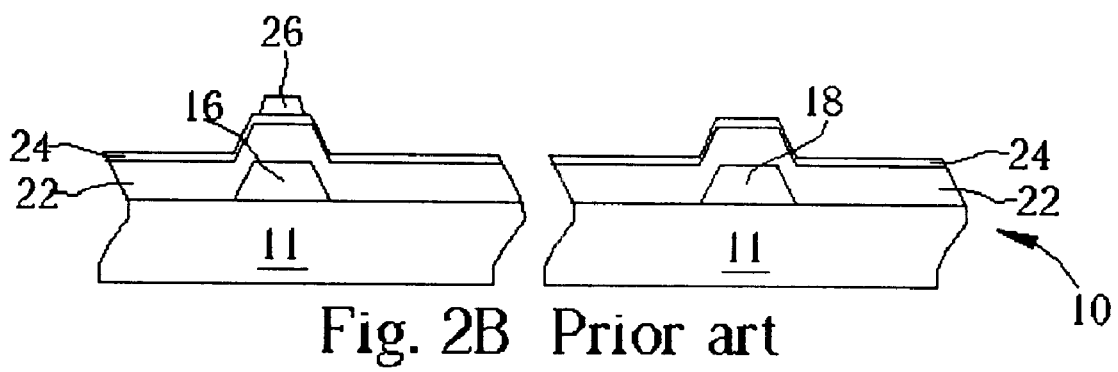
Figure 2C:
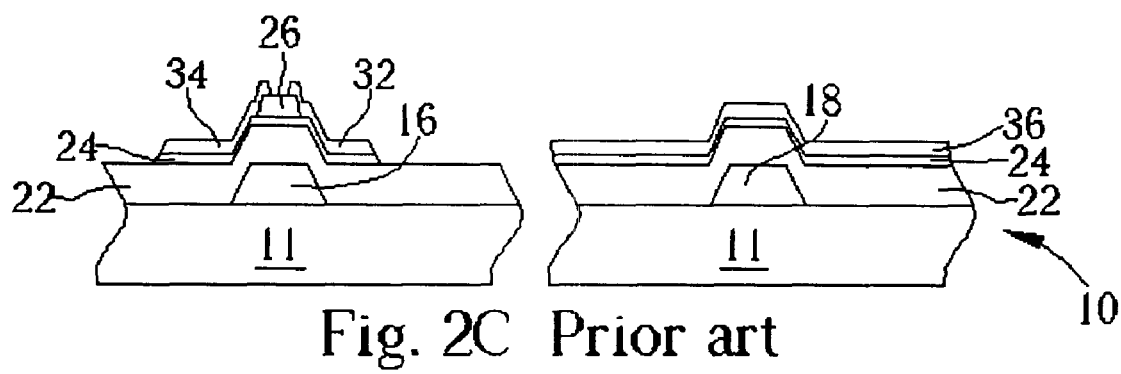
Figure 2D:
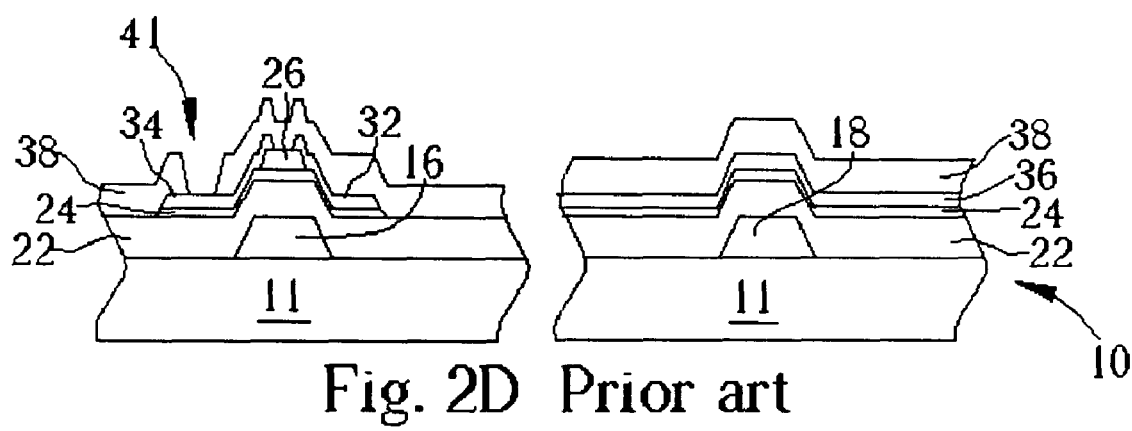
Figure 2E:
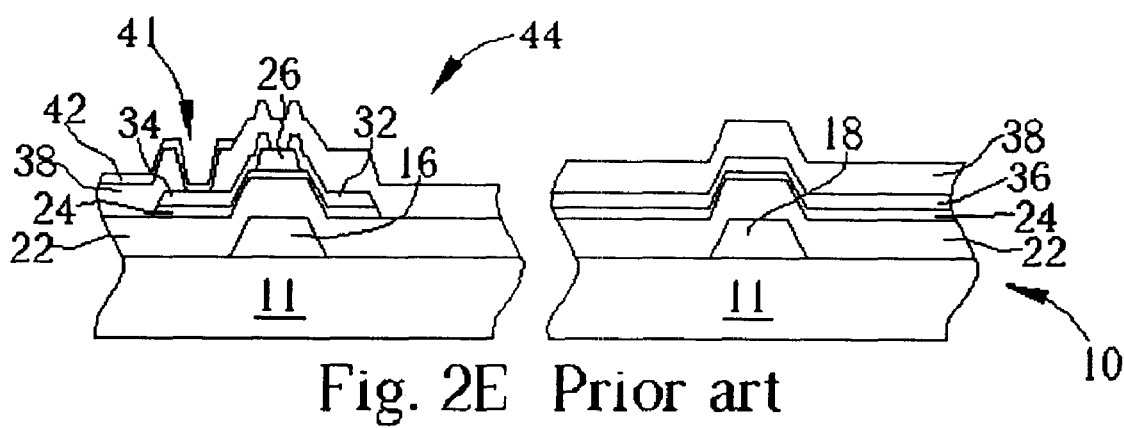
Figure 3:
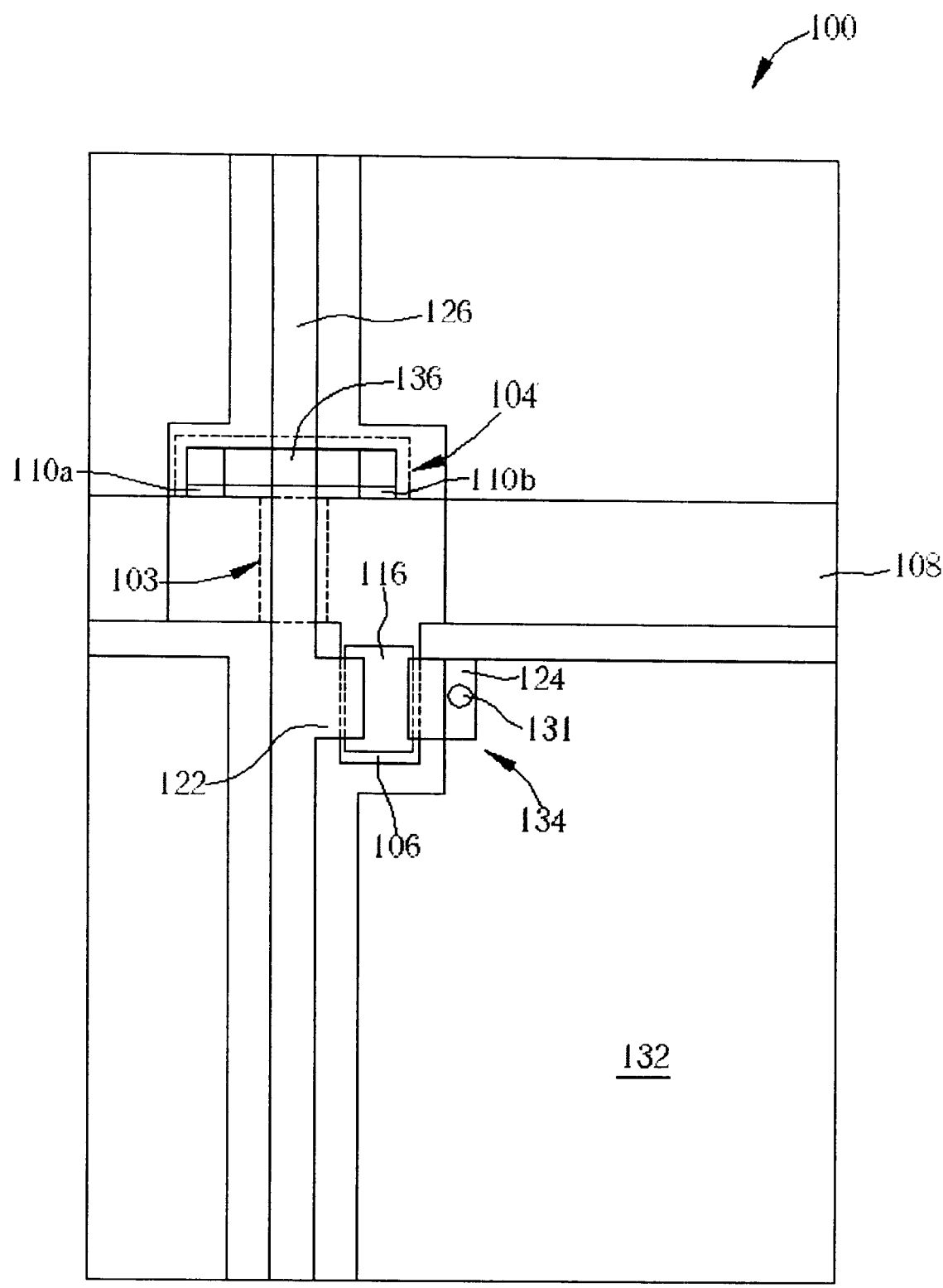
FIG. 3 is a top view of a TFT-LCD device according to the present invention.

Please refer to FIG. 3 to FIG. 5. FIG. 3 is a top view of a TFT-LCD device 100 according to the present invention. FIGS. 4A–4E are cross-sectional diagrams of fabricating a thin film transistor and a repair circuit of the TFT-LCD device 100 shown in FIG. 3. FIGS. 5A–5E are top views of fabricating the thin film transistor and the repair circuit of the TFT-LCD device 100 shown in FIG. 3. The prior art technology utilizes a photo-etching-process (PEP) five times to form the TFT-LCD device 100 on a transparent glass substrate 101. The substrate may be a quartz substrate or a plastic substrate. In FIGS. 3 to FIG. 5E, only the thin film transistor, the pixel electrode, the scan line, the signal line, the repair pads, and a crossover region of the scan line and the signal line are shown.

Please refer to FIG. 3 to FIG. 5E, the substrate 101 (not shown in FIG. 3) comprises at least one thin film transistor (TFT) 134, a scan line 108, and a signal line 126. The thin film transistor 134 is disposed in the transistor region 102 on the substrate 101. The scan line 108 and the signal line 126, orthogonal to the scan line 108, cross in the crossover region 103 on the substrate 101. A source electrode 122 of the thin film transistor 134 is connected to the signal line 126, and a drain electrode 124 of the thin film transistor 134 is connected to a pixel electrode 132 through a via hole 131. An etching stop pattern 116 is disposed on a gate electrode 106.

Since the cross-sectional structure of the crossover region 103 of the scan line 108 and the signal line 126 is as the same as the prior art, it is not shown in FIG. 3 to FIG. 5E. A repair circuit region 104, for forming a repair circuit, corresponding to the thin film transistor 134 and the pixel electrode 132 is on the surface of the substrate 101 (not shown in FIG. 3). Two bottom repair pads 110a, 110b and one top repair pad 136 are disposed in the repair circuit region 104.

Figure 4A:
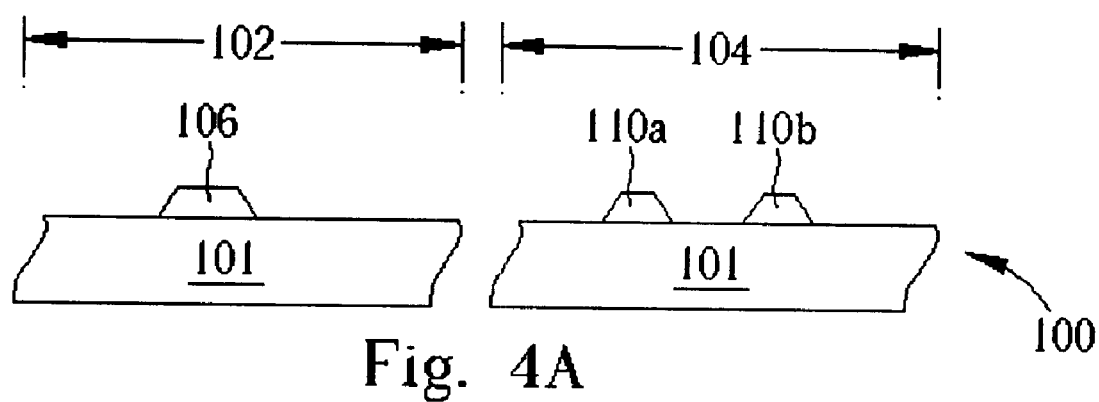
FIGS. 4A–4E are cross-sectional diagrams of fabricating a thin film transistor and a repair circuit of the TFT-LCD device shown in FIG. 3.
Figure 5A:
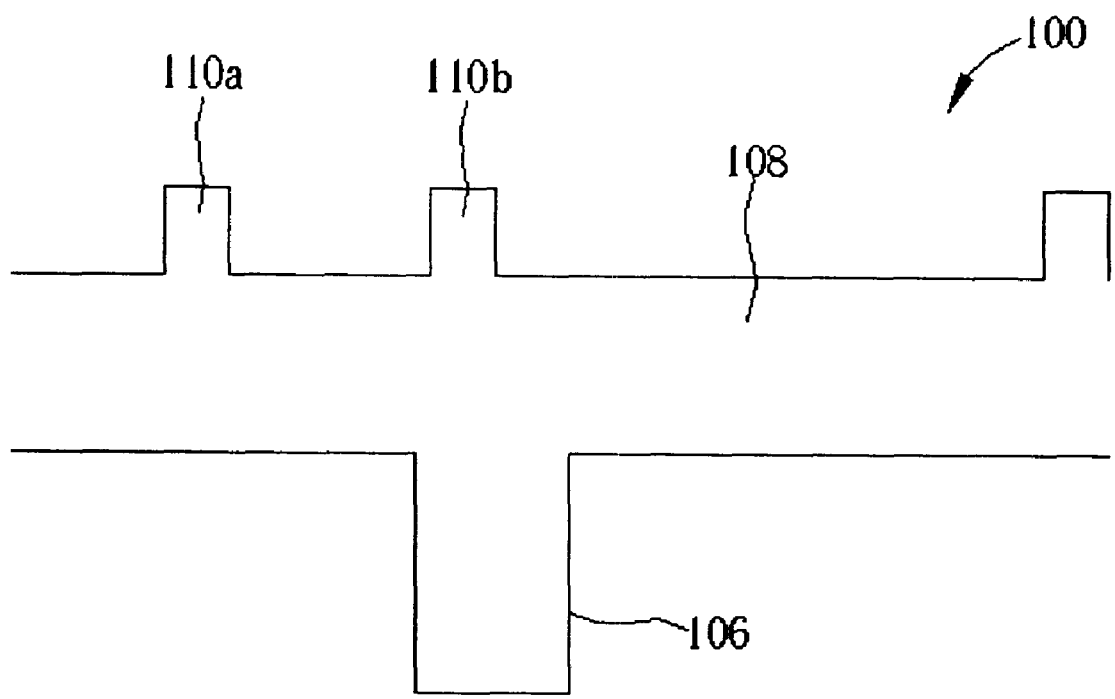
FIGS. 5A–5E are top views of fabricating the thin film transistor and the repair circuit of the TFT-LCD device shown in FIG. 3.

In the present invention method, a first metal layer(not shown) is deposited on the surface of the substrate 101, then a first photo-etching-process(PEP-1) is performed to form a gate electrode 106, a scan line 108 passing through the crossover region 103, and a bottom repair pad 110a, 110b at either side of the crossover region 103 on the surface of the substrate 101, as shown in FIGS. 4A and FIG. 5A. The gate electrode 106 and the bottom repair pads 110a, 110b are connected to the scan line 108. The first metal layer (not shown) is a single-layered metal or a double-layered metal. In the previous case, the first metal layer (not shown) is composed of tungsten. (W), chrome (Cr), copper (Cu), molybdenum (Mo), or the molybdenum-tungsten (MoW) alloy. In the latter case, the first metal layer (not shown) is composed of chrome (Cr) on top of aluminum (Al), molybdenum (Mo) on top of aluminum, molybdenum on top of the aluminum-neodynium (AlNd) alloy, molybdenum-tungsten (MoW) alloy on top of aluminum, or molybdenum-tungsten (MoW) alloy on top of aluminum-neodynium (AlNd) alloy. The above-mentioned material compositions of the double-layered metal are examples frequently seen. Actually, the material compositions of the double-layered metal could be the random combination of chrome (Cr), aluminum (Al), molybdenum (Mo), aluminum-neodynium (AlNd) alloy, and molybdenum-tungsten (MoW) alloy.

After the PEP-1, a gate insulator layer 112 and a semiconductor layer 114 are deposited on the substrate 101. The gate insulator layer 112, composed of silicon oxide ($SiO_x$), silicon nitride ($SiN_y$), or silicon oxynitride ($SiO_xN_y$), may be a single dielectric layer or a composite dielectric layer. The semiconductor layer 114, also called as an active layer, is a hydrogenated amorphous silicon layer ($\alpha$-Si:H layer), and is used as a channel when the thin film transistor 134 is turning on. The semiconductor layer 114 could be a polysilicon layer.

Figure 4B:
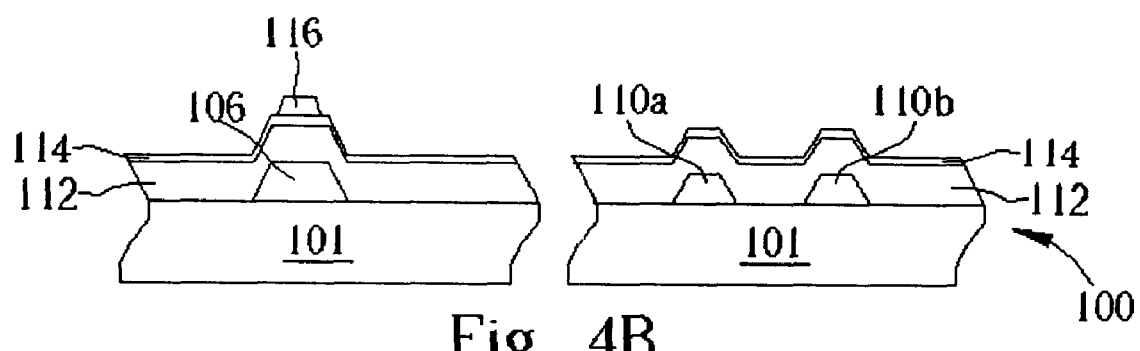
Figure 5B:
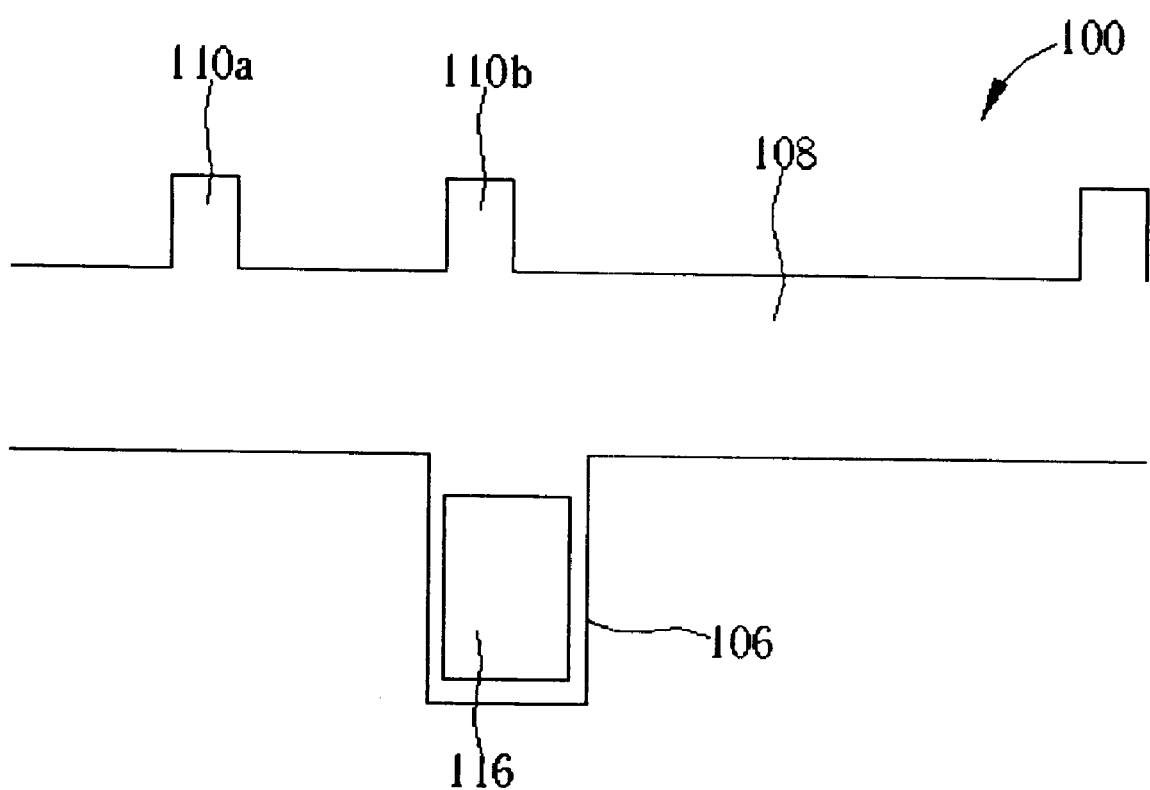

Then, an etching stop layer (not shown), composed of silicon nitride, is formed on the substrate 101. Actually, the gate insulator layer 112, the semiconductor layer 114, and the etching stop layer (not shown) are formed in the same chamber during a continuous plasma enhanced chemical vapor deposition (PECVD) process. A second photo-etching-process(PEP-2) is thereafter performed to form an etching stop pattern 116 above the gate electrode 106 to prevent the semiconductor layer 114 from damaging in subsequent etching process. In the crossover region 103 and the repair circuit region 104, the etching stop layer (not shown) is not retained at all as is shown in FIGS. 4B and 5B.

Figure 4C:
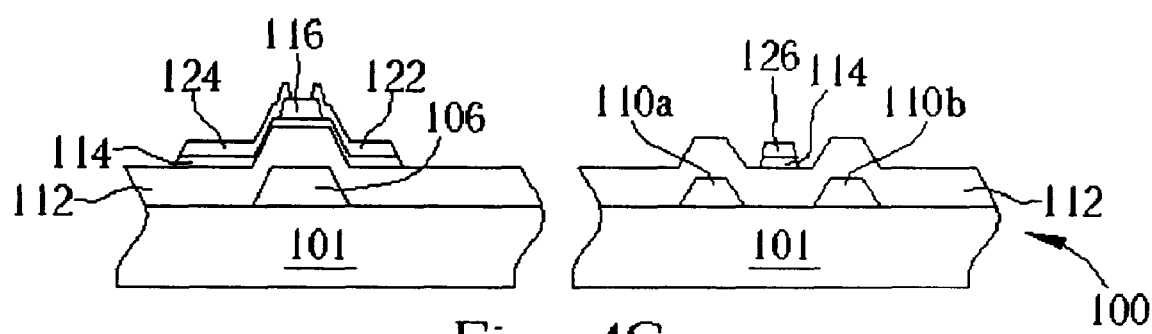
Figure 5C:
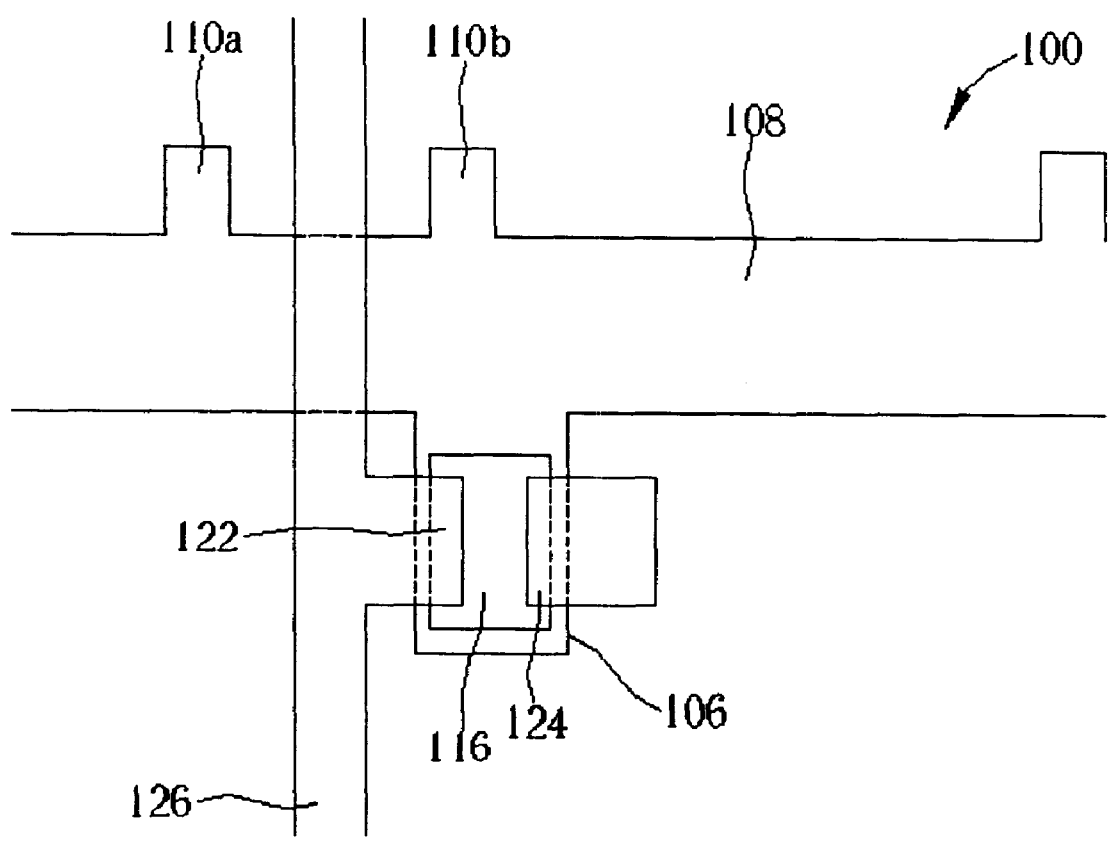

After that as shown in FIGS. 4C and 5C, a doped semiconductor layer ($n^+$ layer, not shown) is deposited on the semiconductor layer 114 and the etching stop pattern 116. The doped semiconductor layer (not shown) is usually composed of amorphous silicon doped with phosphor. A second metal layer (not shown) is thereafter deposited on the doped semiconductor layer (not shown). Then a third photo-etching-process (PEP-3) is performed to pattern the second metal layer (not shown), the doped semiconductor layer (not shown), and the semiconductor layer 114 for forming the source electrode 122 and the drain electrode 124 and for defining the active area (not shown) of the thin film transistor in the transistor region 102, and for forming a signal line 126 passing through the crossover region 103, and the repair circuit region 104 simultaneously.

The second metal layer (not shown) is a single-layered metal or a multi-layered metal. In the previous case, the second metal layer (not shown) is composed of tungsten (W), chrome (Cr), copper (Cu), or Molybdenum (Mo). In the latter case, the second metal layer (not shown) is composed of chrome (Cr) on top of aluminum (Al), molybdenum (Mo) on top of aluminum, molybdenum on top of aluminum-neodynium (AlNd) alloy, molybdenum-tungsten (MoW) alloy on top of aluminum, or molybdenum-tungsten (MoW) alloy on top of aluminum-neodynium (AlNd) alloy or sandwich structure as molybdenum/aluminum/molybdenum (Mo/Al/Mo) or molybdenum/aluminum-neodynium /molybdenum (Mo/AlNd/Mo). The above-mentioned material compositions of the multi-layered metal are examples frequently seen. Actually, the material compositions of the multi-layered metal could be the random combination of chrome (Cr), aluminum (Al), molybdenum (Mo), aluminum-neodynium (AlNd) alloy, and molybdenum-tungsten (MoW) alloy. The doped semiconductor layer (not shown) is used to improve the ohmic contact of the second metal layer (not shown) to the semiconductor layer 114 to avoid the contacting problems between the second metal layer (not shown) and the semiconductor layer 114.

Figure 4D:
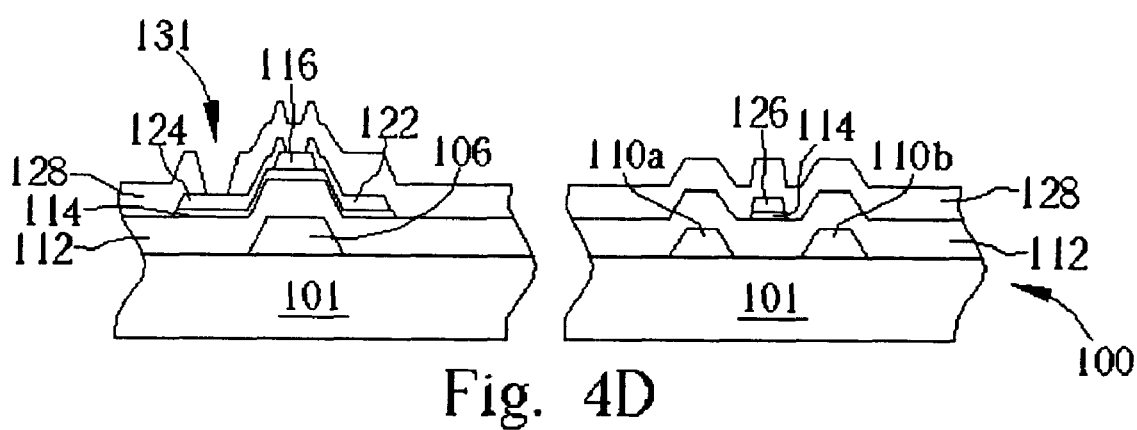
Figure 5D:
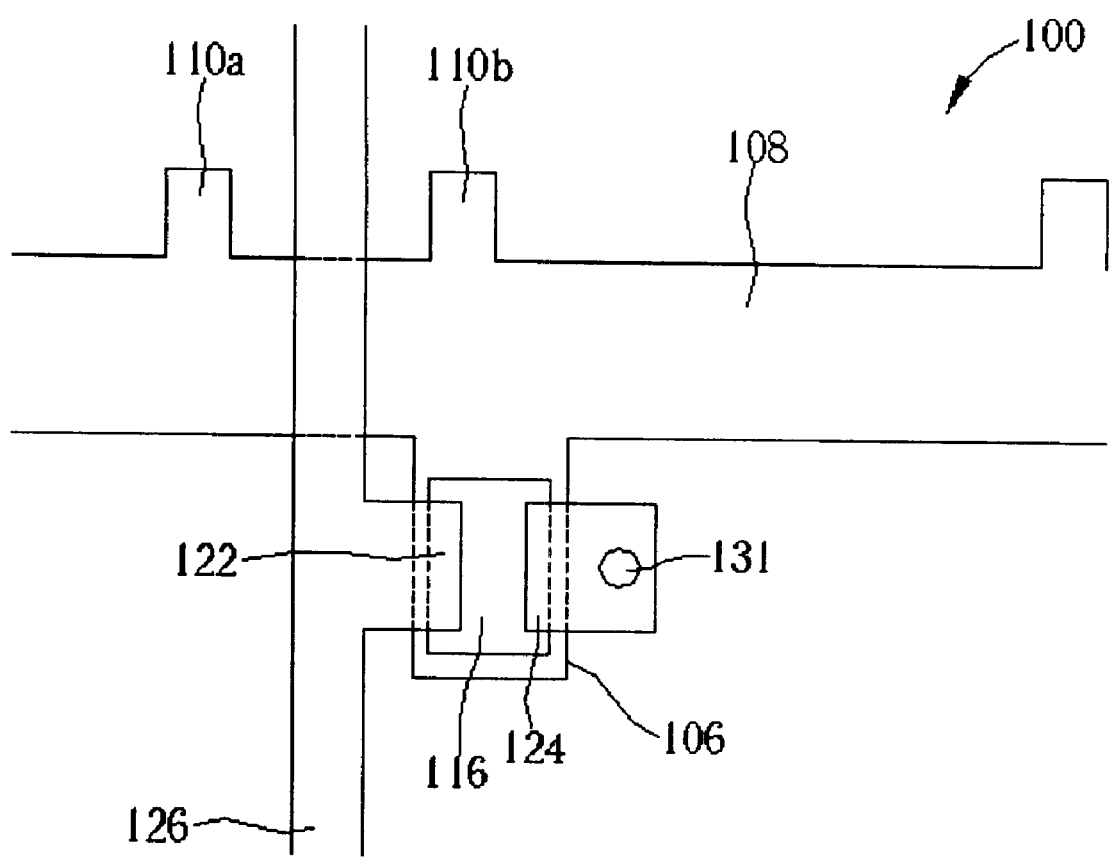

A passivation layer 128, composed of silicon oxide or silicon nitride, is thereafter formed on the substrate 101. After that, a fourth photo-etching-process(PEP-4) is performed to remove portions of the passivation layer 128 atop the drain electrode 124 of the thin film transistor 134 to form a via hole 131 in the passivation layer 128, and to remove portions of the passivation layer 128 and the gate insulator layer 112 on top of the first metal electrode in the peripheral area of the panel to form a via hole for contacting the first metal electrode with the common electrode of color filter in subsequent process (not shown). The via hole 131 extends from the top surface of the passivation layer 128 up to the top surface of the drain electrode 124 to expose portions of the drain electrode 124 as is shown in FIGS. 4D and 5D.

Figure 4E:
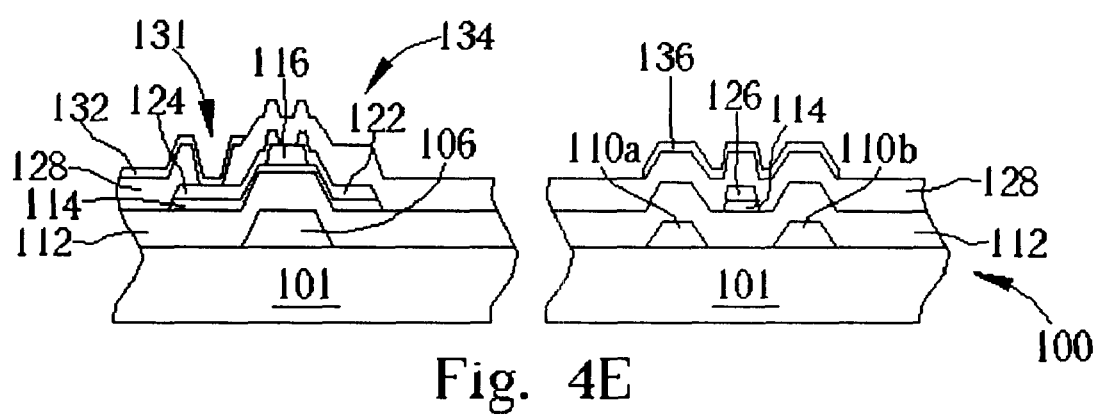
Figure 5E:
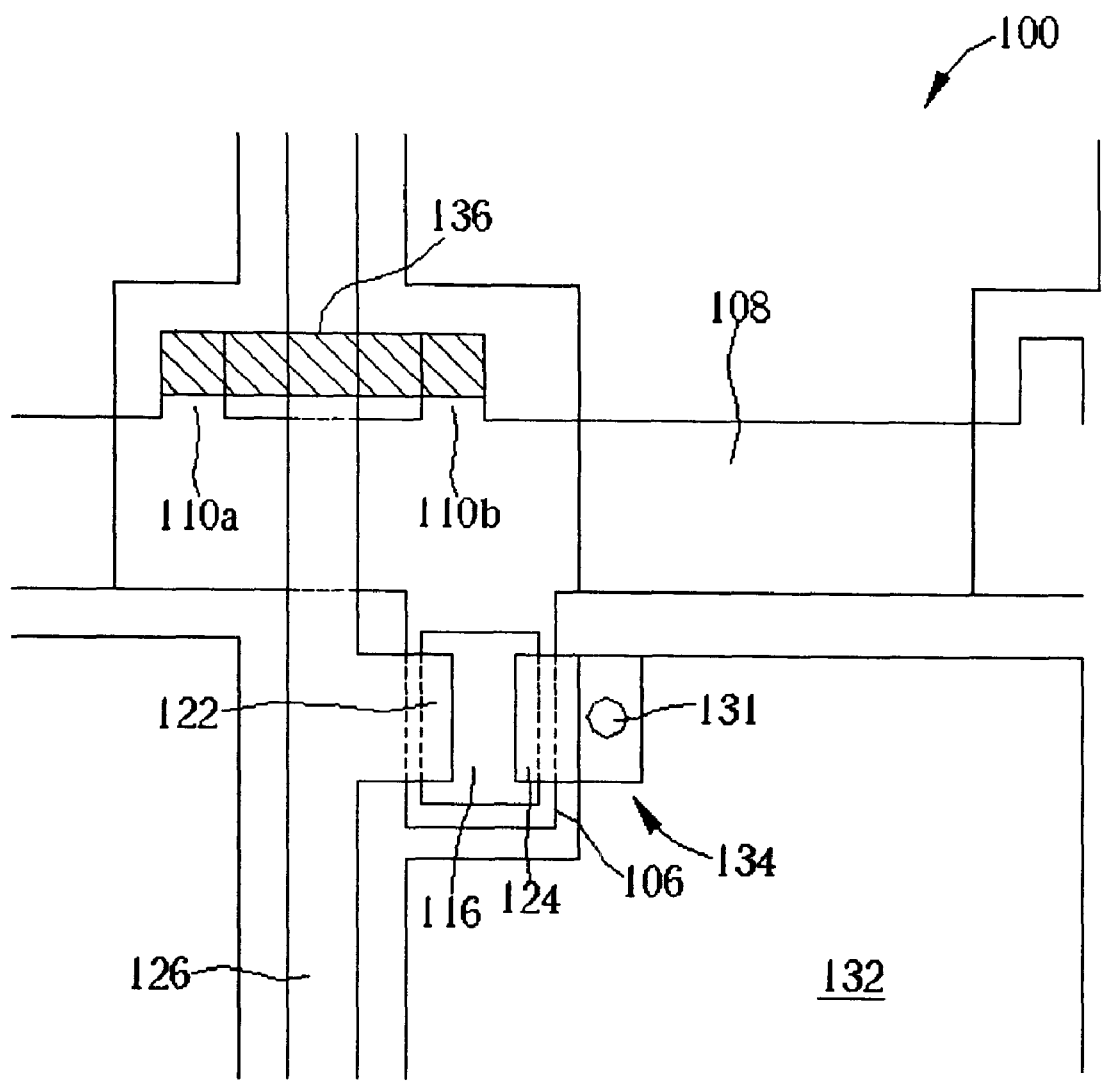

Then a transparent conductive layer(not shown), composed of indium tin oxide (ITO) or indium zinc oxide (IZO), is formed on substrate 101. A fifth photo-etching-process (PEP-5) is thereafter performed for forming a pixel electrode 132 electrically connected to the drain electrode 124 via the via hole 131 of the thin film transistor 134 to complete the fabrication of the thin film transistor 134. At the same time, a top repair pad 136 is formed atop the repair circuit region 104, and the top repair pad 136 is above the bottom repair pads 110a, 110b. As shown in FIG. 4E and FIG. 5E, the fabrication of the present invention TFTLCD 100 is thus completed.

Referring to FIG. 3, FIG. 4, and FIG. 5, the scan line 108 and the bottom repair pads 110a, 110b are electrically connected to each other. The signal line 126 and the bottom repair pads 110a, 110b are electrically isolated from each other by the gate insulator layer 112. The passivation layer 128 and the gate insulator layer 112 are positioned between the top repair pad 136 and the bottom repair pads 110a, 110b. Similarly, only the doped semiconductor layer (not shown), the semiconductor layer 114 and the gate insulator layer 112 are positioned between the signal line 126 and the scan line 108 in the crossover region 103 where the signal line 126 and the scan line 108 both pass through.

After completing the fabrication of the TFT-LCD device 100, a testing step such as an array test is performed to detect the good/bad of each pixel according to the present invention method. If the testing result indicates that the leakage current of each pixel is stable and is less than a predetermined value, the TFT-LCD device 100 is able to function normally. Oppositely, when the gate-signal short phenomenon occurs in the crossover region 103 where the signal line 126 and the scan line 108 both pass through, the measured leakage current is abnormally large. Hence, the repair circuit according to the present invention is utilized to repair the gate-signal short.

Figure 6:
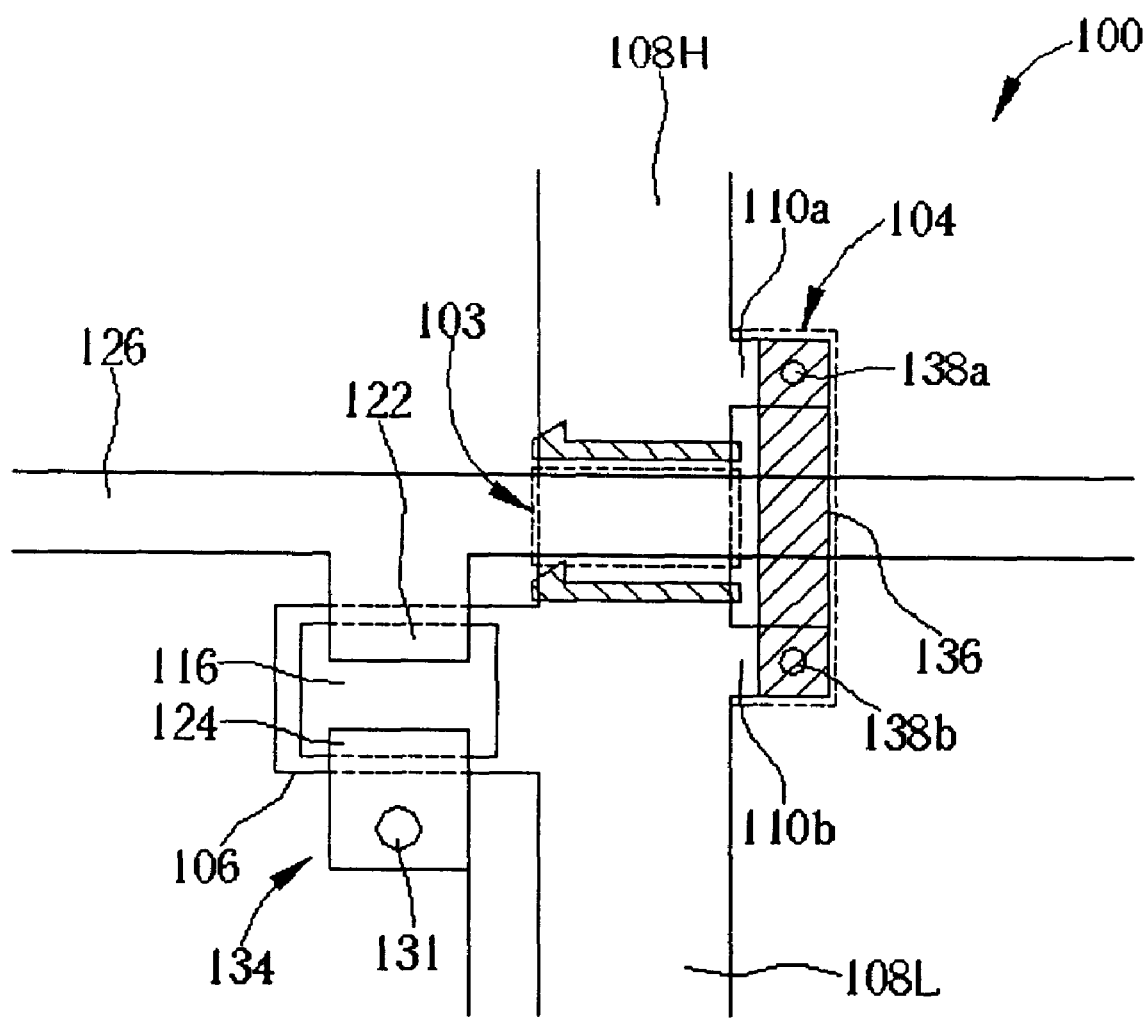
FIG. 6 is a top view of performing a repair on the TFT-LCD device according to the present invention.
Figure 7:
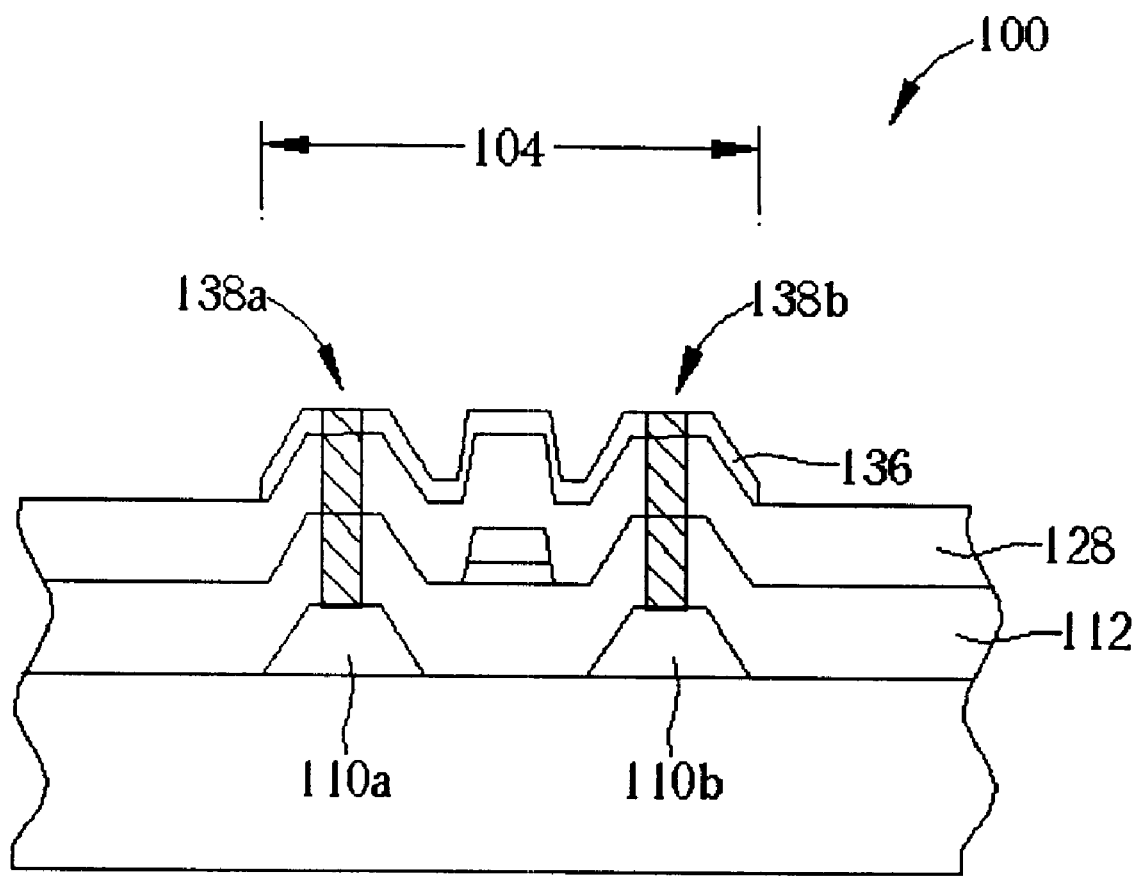
FIG. 7 is a cross-sectional diagram of the repair circuit of the TFT-LCD device shown in FIG. 5 when performing a repair.

Please refer to FIG. 6 and FIG. 7. FIG. 6 is a top view of performing a repair on the TFT-LCD device 100 according to the present invention. FIG. 7 is a cross-sectional diagram of the repair circuit of the TFT-LCD device 100 shown in FIG. 5 when performing a repair.

The repair method according to the present invention comprises the following steps:

(1) a laser cut off step is first performed to cut the scan line 108 at either side of the crossover region where the gate-signal short occurs;

(2) thereafter a laser source or other methodology is utilized to punch through the passivation layer 128 and the gate insulator layer 112 atop the bottom repair pads 110a, 110b to form via holes 138a, 138b;

(3) finally a laser welding process is performed to the top repair pad 136 so that portions of the melting transparent conductive layer fills up the via hole 138a, 138b.

The step (2) and the step (3) may be completed in a same laser welding process, and the step (1) may be performed after the step (2) and the step (3) are completed.

After finishing the repair process, another array test is performed according to the present invention to ensure the gate-signal short is repaired, by measuring the leakage current of each pixel. The driving current or control signal, originally flowing into the gate electrode 106 through the scan line 108, changes its flowing path as the scan line 108H→the bottom repair pad 110a→the top repair pad 136→the bottom repair pad 110b→the scan line 108L→the gate electrode 106, and will not short with the signal line 126. According to the present invention, even though the taper shape being not good, the under cut phenomenon, the metal eruption phenomenon, and unexpected particles result in the gate-signal short phenomenon, the TFT-LCD device 100 still functions normally, rather than being scrapped.

The method of fabricating the TFT-LCD device according to the present invention is to add a repair circuit into the layout, to simultaneously fabricate a bottom repair pad connected to the scan line, at both sides of the crossover region when forming the scan line, and to retain the transparent conductive layer atop the bottom repair pads when etching the transparent conductive layer. When performing the repair process, a laser repair process includes the steps of cutting off the scan line, punching through the passivation layer and the gate insulator layer and laser welding the top repair pad is performed to the gate-signal short portion. Therefore, the repair process is very easily performed to ensure a certain production yield without adding extra process steps.

In comparison with the prior art method of fabricating the TFT-LCD, the present invention method simultaneously fabricates a bottom repair pad, connected to the scan line, at either side of the crossover region when forming the scan line, and to retain the transparent conductive layer atop the bottom repair pad when etching the transparent conductive layer. During the repair process, a simple and feasible laser repair process is performed to the gate-signal short portion. Not only the number of process steps is not increased, but also a certain production yield is ensured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a thin film transistor liquid crystal display (TFT-LCD) with a repair circuit, the method comprising the step of:

providing a substrate, at least one transistor region for forming a thin film transistor (TFT) and at least one crossover region being on the substrate;

forming a first metal layer on the substrate;

patterning the first metal layer by removing a part of the first metal layer to form a gate electrode in the transistor area, a scan line passing through the crossover region and a first repair pad at either side of the crossover region simultaneously on the substrate;

depositing a dielectric layer and a semiconductor layer sequentially on the substrate to cover the gate electrode, the scan line, and each first repair pad;

forming an etching stop on the semiconductor layer, the etching stop being positioned above the gate electrode;

depositing a doped semiconductor layer on the semiconductor layer and the etching stop;

forming a second metal layer on the doped semiconductor layer;

patterning the second metal layer, the doped semiconductor layer and the semiconductor layer by removing a part of the second metal layer, the doped semiconductor layer and the semiconductor layer to form a source electrode and a drain electrode and to define an active area of the thin film transistor in the transistor region and to form a signal line passing through the crossover region simultaneously;

forming a passivation layer on the substrate;

patterning the passivation layer by removing a part of the passivation layer positioned above the drain electrode to form a first via hole extending to the top surface of the drain electrode and a second via hole extending to the top surface of a first metal electrode in a peripheral area of the panel;

forming a transparent conductive layer on the substrate to fill up the first via hole on the drain electrode; and patterning the transparent conductive layer by removing a part of the transparent conductive layer to form a pixel electrode electrically connected to the drain electrode via the first via hole and simultaneously form a second repair pad above each first repair pad, each first repair pad and the second repair pad form a repair circuit region.

2. The method of claim 1 wherein the substrate comprises a glass substrate, a quartz substrate, or a plastic substrate.

3. The method of claim 1 wherein the first metal layer is a single-layered metal and the material composition of the first metal layer comprises tungsten (W), chrome (Cr), copper (Cu), molybdenum (Mo), or a molybdenum-tungsten (MoW) alloy.

4. The method of claim 1 wherein the first metal layer is a double-layered metal and the material compositions of the first metal layer comprise chrome (Cr), aluminum (Al), molybdenum (Mo), an aluminum-neodynium (AlNd) alloy, or a molybdenum-tungsten (MoW) alloy.

5. The method of claim 1 wherein the dielectric layer is used as a gate insulator layer of the thin film transistor and the dielectric layer is substantially composed of silicon oxide($SiO_x$), silicon nitride ($SiN_y$), or silicon oxynitride ($SiO_xN_y$).

6. The method of claim 1 wherein the semiconductor layer is substantially an amorphous silicon layer (α-Si layer).

7. The method of claim 1 wherein the etching stop is substantially composed of silicon nitride.

8. The method of claim 1 wherein the doped semiconductor layer is substantially composed of amorphous silicon doped with phosphor.

9. The method of claim 1 wherein the doped semiconductor layer is substantially composed of micro-crystalline silicon doped with phosphor.

10. The method of claim 1 wherein the second metal layer is a single-layered metal and the material composition of the second metal layer comprises tungsten (W), chrome (Cr), copper (Cu), or molybdenum (Mo).

11. The method of claim 1 wherein the second metal layer is a multi-layered metal and the material compositions of the second metal layer comprise chrome (Cr), aluminum (Al), molybdenum (Mo), an aluminum-neodymium (AlNd) alloy, or a molybdenum-tungsten (MoW) alloy.

12. The method of claim 1 wherein the passivation layer is substantially composed of silicon oxide($SiO_x$) or silicon nitride($SiN_y$).

13. The method of claim 1 wherein the transparent conductive layer is substantially composed of indium tin oxide(ITO) or indium zinc oxide (IZO).

14. The method of claim 1 wherein the repair circuit comprises the first repair pad made from the first metal layer and the second repair pad made from the transparent conductive layer.

15. The method claim 14 wherein the transparent conductive layer is on top of the first metal layer in the repair circuit.

16. The method of claim 1 wherein a repair step is performed when the scan line and the signal line is short-circuiting.

17. The method of claim 16 wherein the repair step further comprises the following sub steps:

punching through the dielectric layer and the passivation layer above each first repair pad to form two third via holes respectively; and performing a laser welding process to the second repair pad to fill up each third via hole with portions of the melting transparent conductive layer.

18. The method of claim 17 further comprises a laser cut off step to remove portions of the scan line around the crossover region.

19. The method of claim 18 wherein the control signal of the scan line is conducted into the gate electrode through each first repair pad and the second repair pad rather than through the scan line in the crossover region after completing the repair step.

* * * * *